(12) United States Patent
Kim (10) Patent No.: US 10,038,038 B2
(45) Date of Patent: Jul. 31, 2018

(54) DISPLAY DEVICE

(71) Applicant: Samsung Display Co., Ltd., Yongin-si, Gyeonggi-do (KR)

(72) Inventor: Sungkook Kim, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/403,079

(22) Filed: Jan. 10, 2017

(65) Prior Publication Data

US 2017/0200775 A1    Jul. 13, 2017

(30) Foreign Application Priority Data

Jan. 11, 2016    (KR) .................. 10-2016-0003335

(51) Int. Cl.
*H01L 27/32* (2006.01)
*H01L 23/544* (2006.01)
*H01L 51/52* (2006.01)

(52) U.S. Cl.
CPC ...... *H01L 27/3246* (2013.01); *H01L 27/3223* (2013.01); *H01L 27/3258* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 2011/0181809 A1* | 7/2011 | Sekiguchi | G02F 1/133615 349/62 |
| 2012/0146060 A1* | 6/2012 | Moon | H01L 27/3276 257/88 |
| 2013/0112979 A1 | 5/2013 | Nam et al. | |
| 2013/0286462 A1 | 10/2013 | Yeo et al. | |
| 2014/0166996 A1* | 6/2014 | Kim | H01L 51/5203 257/40 |
| 2014/0183458 A1* | 7/2014 | Lee | H01L 51/56 257/40 |
| 2014/0217371 A1* | 8/2014 | Kim | H01L 27/3246 257/40 |
| 2017/0062532 A1* | 3/2017 | Jeong | H01L 27/3246 |

FOREIGN PATENT DOCUMENTS

| | | |
|---|---|---|
| KR | 10-2008-0088936 A | 10/2008 |
| KR | 10-2011-0016111 A | 2/2011 |
| KR | 10-2013-0049104 A | 5/2013 |

* cited by examiner

*Primary Examiner* — Seahvosh Nikmanesh
*Assistant Examiner* — Xiaoming Liu
(74) *Attorney, Agent, or Firm* — Knobbe Martens Olson & Bear LLP (57) ABSTRACT

A display device is disclosed. In one aspect, the display device includes a substrate including a display area and a peripheral area adjacent to the display area. The display device also includes a plurality of display elements disposed in the display area. The display device also includes an insulating layer disposed in the display area and the peripheral area, wherein the insulating layer has a non-continuous area disposed in the peripheral area of the substrate.

22 Claims, 4 Drawing Sheets

DISPLAY DEVICE

CROSS-REFERENCE TO RELATED APPLICATION

This application claims the benefit of Korean Patent Application No. 10-2016-0003335, filed on Jan. 11, 2016, in the Korean Intellectual Property Office, the disclosure of which is incorporated herein in its entirety by reference.

BACKGROUND

Field

The described technology generally relates to a display device.

Description of the Related Technology

Generally, a display device can be used as a standalone panel or, more frequently, as a component in various electronic products. For example, the display device may be a part of a mobile device such as a smartphone or tablet computer. When cracks occur in its display area during manufacturing or use, there are problems with image display. For example, images cannot be properly displayed on the cracked region of the display area.

SUMMARY OF CERTAIN INVENTIVE ASPECTS

One inventive aspect relates to a display device that can reduce the occurrence of cracks in a display area during manufacturing or using the display device.

Another aspect is a display device that includes a substrate having a display area and a peripheral area which is outside the display area and surrounds the display area, a plurality of display elements disposed in the display area, and an insulating layer disposed over the substrate and having a non-continuous area in at least a portion of the peripheral area of the substrate.

According to one or more embodiments, the substrate may include a boundary having an indent indented inward, and the non-continuous area may be disposed between the indent and the display area.

According to one or more embodiments, the indent of the substrate may be indented in a direction toward the display area.

According to one or more embodiments, the non-continuous area may extend along a boundary of the display area.

According to one or more embodiments, the insulating layer may include a first insulating layer having a first non-continuous area and a second insulating layer having a second non-continuous area, and the non-continuous area may include a portion in which the first non-continuous area and the second non-continuous area overlap each other.

According to one or more embodiments, a side surface of the first non-continuous area of the first insulating layer and a side surface of the second non-continuous area of the second insulating layer may form a continuous surface.

According to one or more embodiments, the insulating layer may directly contact an upper surface of the substrate at a portion thereof nearest to the non-continuous area.

According to one or more embodiments, the display device may further include a dummy pad having at least a portion disposed over the substrate and extending in a direction thereof.

According to one or more embodiments, the dummy pad may include a non-continuous portion.

According to one or more embodiments, at least a portion of the non-continuous portion may overlap the non-continuous area.

According to one or more embodiments, the display device may further include an additional insulating layer having an additional non-continuous area and covering the dummy pad.

According to one or more embodiments, at least a portion of the additional non-continuous area may overlap the non-continuous area.

According to one or more embodiments, a side surface of the non-continuous area of the insulating layer and a side surface of the additional non-continuous area of the additional insulating layer may form a continuous surface.

According to one or more embodiments, the dummy pad may include a non-continuous portion, and the additional non-continuous area may overlap the non-continuous area and the non-continuous portion.

According to one or more embodiments, a side surface of the non-continuous area of the insulating layer, a side surface of the non-continuous portion of the dummy pad, and a side surface of the additional non-continuous area of the additional insulating layer may form a continuous surface at an overlap portion in which the non-continuous area, the non-continuous portion, and the additional non-continuous area overlap each other.

According to one or more embodiments, the insulating layer may include an inorganic material.

According to one or more embodiments, the display device may further include a protecting layer covering the non-continuous area of the insulating layer.

According to one or more embodiments, the display device may further include a pixel defining film covering a boundary of each pixel electrode of the plurality of display elements, and the protecting layer may include a same material as the pixel defining film.

According to one or more embodiments, the pixel defining film may extend from the display area into the peripheral area, and the protecting layer may be a portion of the pixel defining film.

According to one or more embodiments, the insulating layer may extend into the display area.

Another aspect is a display device comprising: a substrate comprising a display area and a peripheral area adjacent to the display area; a plurality of display elements disposed in the display area; and an insulating layer disposed in the display area and the peripheral area, wherein the insulating layer has a non-continuous area disposed in the peripheral area of the substrate.

In the above display device, the substrate has an outer boundary a portion of which is indented toward the display area, and wherein the non-continuous area is disposed between the indented portion of the outer boundary and the display area. In the above display device, a cross-section of the indented portion has a semicircular shape, wherein the cross-section is parallel to the substrate. In the above display device, the outer boundary has a non-indented portion, and wherein the non-continuous area extends along a direction parallel to the non-indented portion of the outer boundary of the substrate. In the above display device, the insulating layer comprises a first insulating layer having a first non-continuous area and a second insulating layer having a second non-continuous area and wherein the non-continuous area comprises an overlapping portion in which the first non-continuous area and the second non-continuous area overlap each other in the depth dimension of the display device.

In the above display device, a side surface of the first non-continuous area of the first insulating layer and a side surface of the second non-continuous area of the second insulating layer form a continuous surface. In the above display device, The display device of claim 1, wherein the insulating layer directly contacts an upper surface of the substrate at a portion thereof nearest to the non-continuous area. The above display device further comprises: a dummy pad comprising a portion disposed over the insulating layer and extending in a direction thereof. In the above display device, the dummy pad comprises a non-continuous portion. In the above display device, the non-continuous portion of the dummy pad at least partially overlaps the non-continuous area in the depth dimension of the display device. The above display device further comprises: an additional insulating layer comprising an additional non-continuous area and covering the dummy pad.

In the above display device, the additional non-continuous area at least partially overlaps the non-continuous area in the depth dimension of the display device. In the above display device, a side surface of the non-continuous area of the insulating layer and a side surface of the additional non-continuous area of the additional insulating layer form a continuous surface. In the above display device, the dummy pad comprises a non-continuous portion and wherein the additional non-continuous area overlaps the non-continuous area and the non-continuous portion in the depth dimension of the display device. In the above display device, a side surface of the non-continuous area of the insulating layer, a side surface of the non-continuous portion of the dummy pad, and a side surface of the additional non-continuous area of the additional insulating layer form a continuous surface at an overlapping portion in which the non-continuous area, the non-continuous portion, and the additional non-continuous area overlap each other.

In the above display device, the insulating layer is formed of an inorganic material. The above display device further comprises: a protecting layer covering the non-continuous area of the insulating layer. The above display device further comprises: a pixel defining film covering a boundary of each pixel electrode of the plurality of display elements, wherein the protecting layer is formed of the same material as the pixel defining film. In the above display device, the pixel defining film extends from the display area into the peripheral area and wherein the protecting layer is a portion of the pixel defining film. In the above display device, the insulating layer extends into the display area. In the above display device, the insulating layer is formed in the display area and the peripheral area, wherein the insulating layer is continuous in the display area and continuously extends from the display area to a border between the display area and the peripheral area.

Another aspect is a display device comprising: a substrate comprising a display area and a peripheral area adjacent to the display area; a plurality of display elements disposed in the display area; and an insulating layer disposed in the display area and the peripheral area, wherein the insulating layer is continuous in the display area and discontinuous in the peripheral area.

In the above display device, the insulating layer comprises a plurality of insulating layers, and wherein an opening is formed in the insulating layers disposed in the peripheral area to expose the substrate. In the above display device, the opening has a sidewall that is inclined with respect to the substrate. The above display device further comprises: a protecting layer covering the insulating layer disposed in the peripheral area and at least partially filling the opening.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

The present embodiments may have different forms and various embodiments, and should not be construed as being limited to the descriptions set forth herein. Accordingly, the embodiments are merely described below, by referring to the figures, to explain aspects of the present description.

Reference will now be made in detail to embodiments, examples of which are illustrated in the accompanying drawings, wherein like reference numerals refer to like elements throughout. Duplicate descriptions thereof will be omitted.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "and/or" includes any and all combinations of one or more of the associated listed items. Expressions such as "at least one of," when preceding a list of elements, modify the entire list of elements and do not modify the individual elements of the list of the elements.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 1:
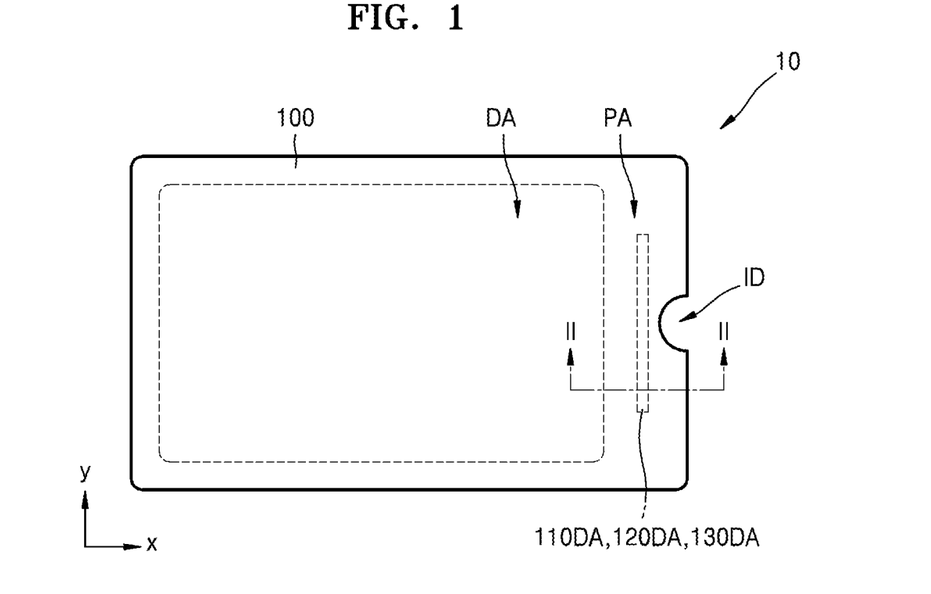
FIG. 1 is a plan view schematically illustrating a display device according to an embodiment.
Figure 2:
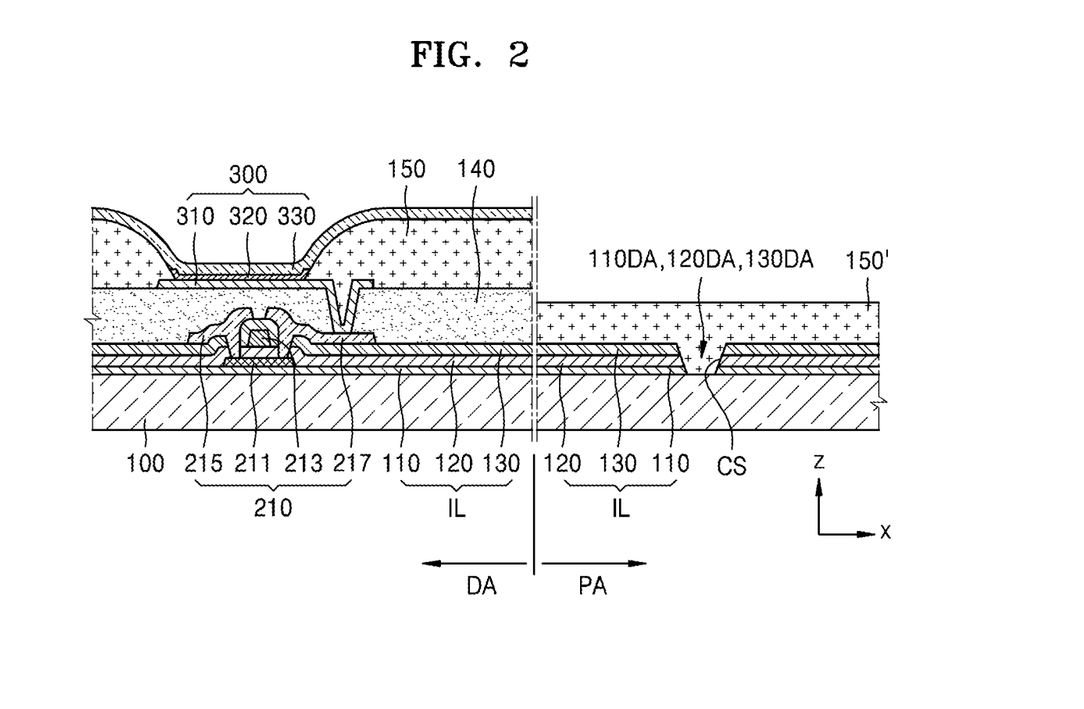
FIG. 2 is a cross-sectional view taken along a line II-II of FIG. 1.

FIG. 1 is a plan view schematically illustrating a display device 10 according to an embodiment, and FIG. 2 is a cross-sectional view taken along a line II-II of FIG. 1. FIG. 2 illustrates that the display device 10 is an organic light-emitting display device having an organic light-emitting element 300.

The display device 10 includes a substrate 100 including a display area DA including organic light-emitting elements 300 as display elements, and a peripheral area PA as a non-display area which is disposed outside the display area DA and surrounds the display area DA. The substrate 100 may include at least one of various materials such as a glass material, a metal material, and a plastic material.

A thin film transistor 210 is disposed in the display area DA of the substrate 100, and the organic light-emitting element 300 may also be disposed in the display area DA and may be electrically connected to the thin film transistor 210. Here, "the organic light-emitting element 300 is electrically connected to the thin film transistor 210" may be understood as "a pixel electrode 310 is electrically connected to the thin film transistor 210." In addition, a thin film transistor (not illustrated) may be disposed in the peripheral area PA of the substrate 100. The thin film transistor disposed in the peripheral area PA may be a portion of a circuit unit to control electrical signals which are applied to the display area DA.

The thin film transistor 210 may include a semiconductor layer 211, a gate electrode 213, a source electrode 215, and a drain electrode 217, which may include amorphous silicon, polysilicon, or organic semiconductor material. A buffer layer 110 may be disposed on the substrate 100, may flatten a surface of the substrate 100 or prevent permeation of foreign materials into the semiconductor layer 211, and may include silicon oxide or silicon nitride. The semiconductor layer 211 may be disposed on the buffer layer 110.

The gate electrode 213 is disposed over an upper surface of the semiconductor layer 211 and electrically communicates with the source electrode 215 and the drain electrode 217 according to signals applied to the gate electrode 213. Considering adhesiveness with an adjacent layer, surface flatness of a layer to be stacked, and workability, the gate electrode 213 may include a single layer or a multilayer including one or more materials among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example. Here, a gate insulating layer 120 may be disposed between the semiconductor layer 211 and the gate electrode 213, and may include silicon oxide and/or silicon nitride, to insulate the semiconductor layer 211 and the gate electrode 213 from each other.

An interlayer insulating layer 130 may be disposed over an upper surface of the gate electrode 213 and may include a single layer or a multilayer which includes silicon oxide or silicon nitride.

The source electrode 215 and the drain electrode 217 are disposed over an upper surface of the interlayer insulating layer 130. The source electrode 215 and the drain electrode 217 may be electrically connected to the semiconductor layer 211 through a contact hole formed in the gate insulating layer 120 and the interlayer insulating layer 130. Considering conductivity, the source electrode 215 and the drain electrode 217 may be a single layer or a multilayer including one or more materials among aluminum (Al), platinum (Pt), palladium (Pd), silver (Ag), magnesium (Mg), gold (Au), Nickel (Ni), Neodymium (Nd), iridium (Ir), chromium (Cr), lithium (Li), calcium (Ca), molybdenum (Mo), titanium (Ti), tungsten (W), and Copper (Cu), for example.

A protecting film 140 may be disposed to cover the thin film transistor 210 to protect the thin film transistor 210. The protecting film 140 may include an inorganic material such as silicon oxide, silicon nitride, or silicon oxynitride. The protecting film 140 may include a single layer or a multi-layer.

A planarization layer (not illustrated) may be disposed over the protecting film 140. Although FIG. 2 illustrates that an upper surface of the protecting film 140 is flat, the protecting film 140 may have a curved upper surface according to a curve of the thin film transistor 210, which is disposed below the protecting film 140, when the protecting film 140 includes an inorganic material. The planarization layer may generally flatten the upper surface of the protecting film 140, which covers the thin film transistor 210, when the organic light-emitting element 300 is disposed over the thin film transistor 210. The planarization layer may include acryl-based organic material or benzocyclobutene (BCB).

The display device 10 may include both the protecting film 140 and the planarization layer or only one of the protecting film 140 and the planarization layer, if necessary.

The organic light-emitting element 300 may be disposed in the display area DA, may be disposed over the planarization layer, and may include the pixel electrode 310, an opposite electrode 330, and an intermediate layer 320 having an emissive layer and between the pixel electrode 310 and the opposite electrode 330. The intermediate layer 320 may overlap the TFT 210 in the depth dimension of the display device 10.

An opening is formed in the protecting film 140, and at least one of the source electrode 215 and the drain electrode 217 of the thin film transistor 210 is exposed through the opening. The pixel electrode 310 is disposed over the protecting film 140 or the planarization layer and is electrically connected to the thin film transistor 210 by contacting one of the source electrode 215 and the drain electrode 217 through the opening. The pixel electrode 310 may be a (semi-)transparent electrode or a reflective electrode. When the pixel electrode 310 includes a (semi-)transparent electrode, the pixel electrode 310 may include indium tin oxide (ITO), indium zinc oxide (IZO), zinc oxide (ZnO), indium oxide ($In_2O_3$), indium gallium oxide (IGO) or aluminum zinc oxide (AZO). When the pixel electrode 310 includes a reflective electrode, the pixel electrode 310 may include a reflective layer having silver (Ag), magnesium (Mg), aluminum (Al), platinum (Pt), palladium (Pd), gold (Au), Nickel (Ni), Neodymium (Nd), Iridium (Ir), chromium (Cr), or a mixture thereof, and a layer including indium tin oxide (ITO), indium zinc oxide (IZO), zinc oxide (ZnO), indium oxide ($In_2O_3$), indium gallium oxide (IGO), or aluminum zinc oxide AZO. However, the present disclosure is not limited thereto. The pixel electrode 310 may include at least one of various materials, and a structure of the pixel electrode 310 may include various modifications, such as a single layer and a multilayer, for example.

A pixel defining film 150 may be disposed over an upper surface of the planarization layer. The pixel defining film 150 includes an opening corresponding to sub-pixels, that is, an opening to expose at least a center portion of the pixel electrode 310, to define a pixel. As illustrated in FIG. 2, the pixel defining film 150 increases a distance between boundaries of the pixel electrode 310 and the opposite electrode 330, which is disposed over the pixel electrode 310, to prevent arc at the boundary of the pixel electrode 310. The pixel defining film 150 may include an organic material such as polyimide.

The intermediate layer 320 of the organic light-emitting element 300 may include a small molecule material or a polymer. When the intermediate layer 320 includes a small molecule material, the intermediate layer 320 may include a stack structure of a single or complex structure including a hole injection layer (HIL), a hole transport layer (HTL), an electron transport layer (ETL), or an electron injection layer (EIL) and may include various organic materials such as copper phthalocyanine (CuPc), N,N-di(naphthalend-1-yl)-N, N-diphenylbenzidine (NPB), tris-8-hydroxyquinoline aluminum (Alq3). The above-described layers may be formed according to a vacuum deposition method.

When the intermediate layer 320 includes a polymer, the intermediate layer 320 may include a structure including an HTL and an emission layer (EML). Here, the HTL includes poly(3,4-ethylenedioxythiophene) (PEDOT), and the EML includes a poly-phenylenevinylene (PPV)-based polymer or a polyfluorene-based polymer. The intermediate layer 320 may be formed according to a screen printing or inkjet printing method or a laser-induced thermal imaging method.

The intermediate layer 320 is not limited to the above-described material and structure, and may have various structures and modifications.

The opposite electrode 330 is disposed over the display area DA and covers the display area DA, as illustrated in FIG. 2. That is, the opposite electrode 330 may be a single body over a plurality of organic light-emitting devices 300 to correspond to a plurality of pixel electrodes 310. The opposite electrode 330 may include a (semi-)transparent electrode or a reflective electrode. If the opposite electrode 330 includes a (semi-)transparent electrode, the opposite electrode 330 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof, which is a metal having a low workability, and a (semi-)transparent conductive layer of ITO, IZO, ZnO or $In_2O_3$. If the opposite electrode 330 includes a reflective electrode, the opposite electrode 330 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof. However, a structure and a material of the opposite electrode 330 are not limited thereto, and the structure and material of the opposite electrode 330 may include various modifications.

The above-described buffer layer 110, the gate insulating layer 120, and the interlayer insulating layer 130 may be collectively referred to as an insulating layer IL. The buffer layer 110, the gate insulating layer 120, and the interlayer insulating layer 130 may each include an inorganic material such as silicon nitride, silicon oxide, and/or silicon oxynitride, and these non-conductive layers including the inorganic material may be collectively referred to as the insulating layer IL. That is, the insulating layer IL may be a multilayer including the inorganic compound. Since the buffer layer 110 is directly disposed on the substrate 100, the insulating layer IL may be referred to as a layer which directly contacts an upper surface of the substrate 100 and includes the inorganic compound.

The insulating layer IL may be disposed in the peripheral area PA and may be also disposed in the display area DA. Accordingly, the insulating layer IL may be understood as a layer extending from the peripheral area PA to the display area DA or as a layer extending from the display area DA to the peripheral area PA. The insulating layer IL may include non-continuing areas or discontinuous areas, for example, first, second, and third non-continuing areas 110DA, 120DA, and 130DA in at least a portion of the peripheral area PA of the substrate 100, as illustrated in FIGS. 1 and 2. That is, the insulating layer IL contacts the upper surface of the substrate 100 at a portion of the insulating layer IL nearest to the first, second, and third non-continuing areas 110DA, 120DA, and 130DA and includes a layer having an inorganic material.

For example, the buffer layer 110 may be a first insulating layer and may include a first non-continuing area 110DA, the gate insulating layer 120 may be the second insulating layer and may include the second non-continuing area 120DA, and the interlayer insulating layer 130 may be a third insulating layer and may include the third non-continuing area 130DA. A non-continuous area may be an area in which the first non-continuing area 110DA, the second non-continuing area 120DA, and the third non-continuing area 130DA overlap each other. In FIG. 2, the first non-continuing area 110DA, the second non-continuing area 120DA, and the third non-continuing area 130DA match each other, and a side surface of the first non-continuing area 110DA of the buffer layer 110, a side surface of the second non-continuing area 120DA of the insulating layer 120, and a side surface of the third non-continuing area 130DA of the interlayer insulating layer 130 may form a continuous surface CS that is continuous from the top surface of the interlayer insulating layer 130 to the top surface of the substrate 100. The non-continuing areas 110DA-130DA may form an opening that exposes the substrate 100. In some embodiments, as shown in FIG. 2, the opening has a sidewall that is inclined with respect to the substrate 100. In other embodiments, the opening has a sidewall that is substantially perpendicular to the substrate 100. The sidewall of the opening may be curved or linear. The continuous surface CS may be formed when the buffer layer 110, the insulating layer 120, and the interlayer insulating layer 130 are simultaneously patterned to form the first, second, and third non-continuing areas 110DA, 120DA, and 130DA during a manufacturing process of the display device.

In contrast, the insulating layer IL may include two insulating layers, that is, the first insulating layer and the second insulating layer. The non-continuous area of the insulating layer IL may be an area in which the first non-continuing area 110DA of the first insulating layer and the second non-continuing area 120DA of the second insulating layer overlap each other. Although the insulating layer IL may include a plurality of insulating layers, that is, the first insulating layer and the second insulating layer, and although the first non-continuing area 110DA of the first insulating layer and the second non-continuing area 120DA of the second insulating layer may include an overlap area but may partially overlap each other, the side surface of the first non-continuing area 110DA of the first insulating layer and the side surface of the second non-continuing area 120DA of the second insulating layer may not match each other, and thus the continuous surface CS is not formed.

During manufacturing the display device or using the display device after the display device is manufactured, pressure may be applied to the insulating layer IL. For example, since a portable electronic device, such as a smart phone or a smart pad, generally has a touch screen function, the pressure is continuously applied to the display device when the display device is repeatedly touched during usage thereof. In addition to the above-described pressure, an external shock may be exerted on the display device. When the pressure is applied to the display device, cracks may occur in the insulating layer IL. If the cracks do not occur in the display area DA but occur in the peripheral area PA, the cracks may not directly affect an image which is displayed on the display area DA at the moment when the cracks occur. However, once the cracks occur in the insulating layer IL, even a small shock may elongate a length and a size of the cracks in the insulating layer IL, and then later, the cracks may extend from the peripheral area PA into an inside of the display area DA. In this case, a defect pixel may be generated in the display area DA.

However, in the display device according to an embodiment, at least a portion of the peripheral area PA of the insulating layer IL may include the first, second, and third non-continuing areas 110DA, 120DA, and 130DA. When the insulating layer IL includes the first, second, and third non-continuing areas 110DA, 120DA, and 130DA, the cracks may not pass through or extend beyond the first, second, and third non-continuing areas 110DA, 120DA, and 130DA even if the cracks occur in the insulating layer IL and lengths of the cracks are elongated. Accordingly, the display device according to an embodiment may prevent or reduce the occurrence of the above-described defect.

Particularly, the substrate 100 may include a boundary having an indent ID which is indented in an inward (−x) direction, that is, in a direction toward the display area DA, as illustrated in FIG. 1. When the display device is a portion of an electronic device, such as a smart phone or a smart pad, the electronic device may need a space, that is, the indent ID, in which a button or a camera unit is included in the electronic device. In this case, the boundary having the indent ID is not a straight line, and thus a portion of the insulating layer IL, which is adjacent to the indent ID, may receive a non-uniform force, compared to other portions of the insulating layer IL. Accordingly, cracks may occur at the portion of the insulating layer IL adjacent to the indent ID. Particularly, as described above, when the button is disposed at the indent ID and is clicked a plurality of times during usage of the electronic device, an external force is repeatedly applied to the portion of the insulating layer IL adjacent to the indent ID, and thus the cracks may occur at the portion of the insulating layer IL adjacent the indent ID.

Figure 3:
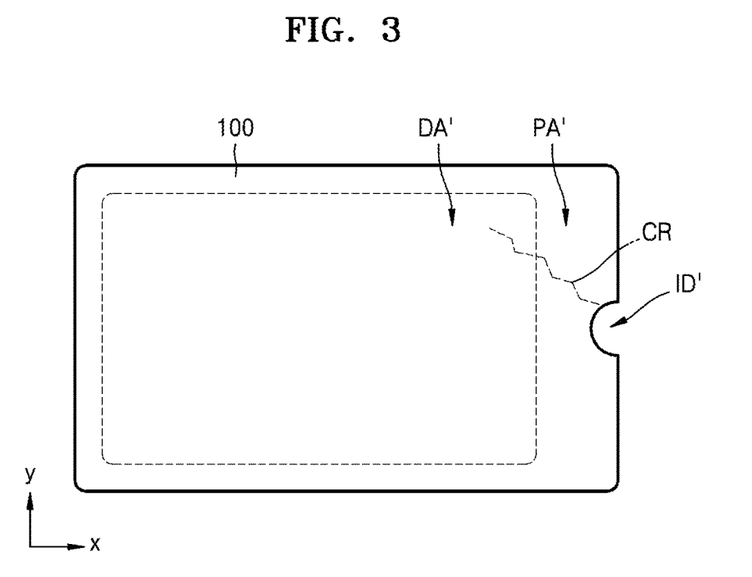
FIG. 3 is a plan view schematically illustrating a display device as a comparative example.

When the crack occurs at the insulating layer IL adjacent to the indent ID, a length of the crack elongates and extends into the display area DA in a comparative display device, as illustrated in FIG. 3. In this case, a defect pixel is generated in the display area DA.

However, in the display device according to an embodiment, the insulating layer IL includes the first, second, and third non-continuing areas 110DA, 120DA, and 130DA in at least a portion of the peripheral area PA. Such as, when the insulating layer IL includes the first, second, and third non-continuing areas 110DA, 120DA, and 130DA, cracks do not elongate and extend by passing through the first, second, and third non-continuing areas 110DA, 120DA, and 130DA even if the cracks occur in the insulating layer IL and a length of the cracks elongates. Accordingly, a defect is prevented or reduced in the display device according to an embodiment. Particularly, as illustrated in FIG. 1, since the insulating layer IL includes the first, second, and third non-continuing areas 110DA, 120DA, and 130DA between the indent ID and the display area DA, the cracks are prevented from being extended into the display device even if the cracks occur at a vicinity of the indent ID in the insulating layer IL.

Figure 4:
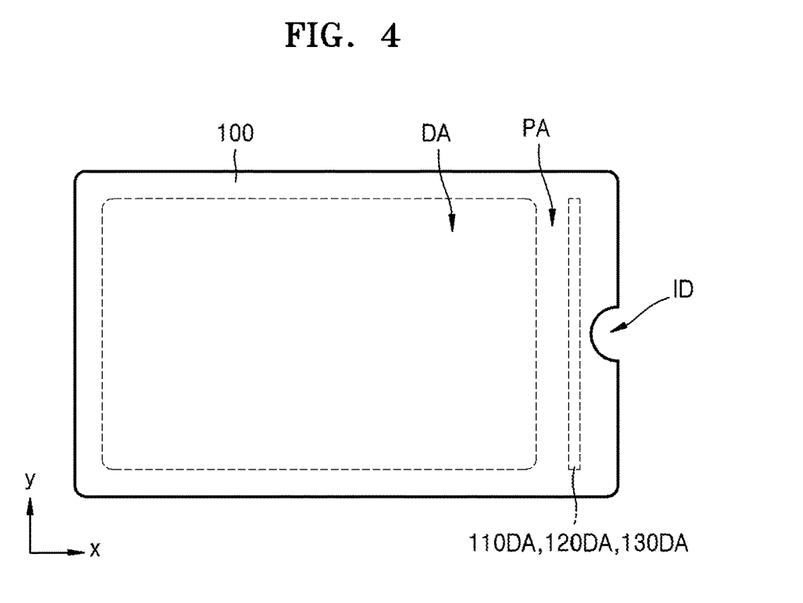
FIG. 4 is a plan view schematically illustrating a display device according to another embodiment.
Figure 5:
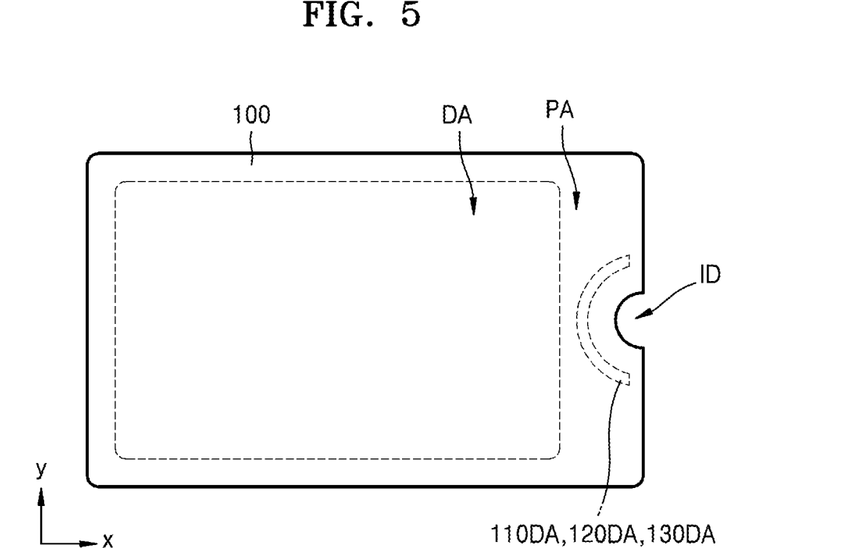
FIG. 5 is a plan view schematically illustrating a display device according to another embodiment.

The first, second, and third non-continuing areas 110DA, 120DA, and 130DA of the insulating layer IL may extend along the boundary of the display area DA of the display device, as illustrated in FIG. 4. Although FIG. 4 illustrates that the first, second, and third non-continuing areas 110DA, 120DA, and 130DA of the insulating layer IL extend along the boundary of the display area DA in an indent ID direction, the present disclosure is not limited thereto. For example, the first, second, and third non-continuing areas 110DA, 120DA, and 130DA of the insulating layer IL may surround the display area DA. Moreover, in a display device according to another embodiment, as illustrated in FIG. 5, the first, second, and third non-continuing areas 110DA, 120DA, and 130DA of the insulating layer IL may be disposed between the display area DA and the indent ID and may have a shape surrounding the indent ID. This structure may be applied to embodiments and modifications which will be described later.

Meanwhile, as illustrated in FIG. 2, a protecting layer 150' may be further provided to cover the first, second, and third non-continuing areas 110DA, 120DA, and 130DA of the insulating layer IL. The protecting layer 150' may substantially fill the opening defined by the non-continuing areas 110DA, 120DA, and 130DA, as shown in FIG. 2. The protecting layer 150' may also partially fill the opening. The protecting layer 150' may include the same material as the pixel defining film 150 of the display area DA. Moreover, the protecting layer 150' may be a single body with the pixel defining film 150. In this case, the pixel defining film 150 may extend from the display area DA into the peripheral area PA, and the protecting layer 150' may be a portion of the pixel defining film 150. The protecting layer 150' may include an organic material, such as polyimide, and may protect the insulating layer IL in the peripheral area PA. Since the protecting layer 150' includes the organic material, cracks do not occur in the insulating layer IL, or a length of the cracks are not gradually elongated in the insulating layer IL even if the cracks occur in the insulating layer IL. This is applied to the above-described embodiments and modifications and also to embodiments and modifications which will be described later.

Figure 6:
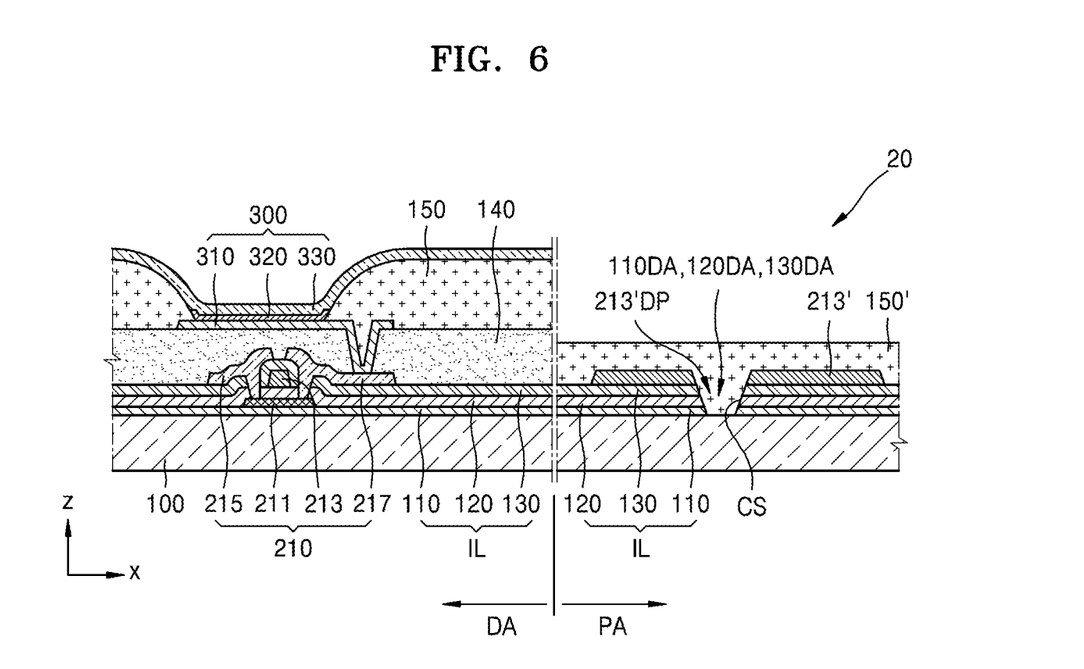
FIG. 6 is a cross-sectional view schematically illustrating a display device according to another embodiment.

FIG. 6 is a cross-sectional view schematically illustrating a display device 20 according to another embodiment. As illustrated in FIG. 6, the display device 20 includes a dummy pad 213' in the peripheral area PA. The dummy pad 213' may have at least a portion disposed on the insulating layer IL and may have a shape which extends in a direction (+x direction). The dummy pad 213' may include the same material as the gate electrode 213 of the display area DA and may be disposed on the same layer as the gate electrode 213 of the display area DA. Here, the dummy pad 213' may include a non-continuous portion 213'DP, as illustrated in FIG. 6. In addition, at least a portion of the non-continuous portion 213'DP may overlap the first through the third non-continuous areas 110DA, 120DA, and 130DA of the insulating layer IL.

As described above, when cracks occur in the insulating layer IL of the peripheral area PA, the cracks are prevented from growing into the display area DA since the insulating layer IL includes the first through third non-continuous areas 110DA, 120DA, and 130DA. However, when cracks occur in the dummy pad 213', the cracks may grow in a direction toward the display area DA along the dummy pad 213'. In this case, when the dummy pad 231' extends inside the display area DA, the cracks may result in growing into the display area DA along the dummy pad 213'. Although the dummy pad 213' does not extend inside the display area DA but is in the peripheral area PA, the cracks may grow along the dummy pad 213' and then may grow along at least one of the layers of the insulating layer IL to further grow inside the display area DA.

However, in the display apparatus according to another embodiment, the dummy pad 213' may include the non-continuous portion 213'DP. Accordingly, growing of the cracks in a direction toward the display area DA along the dummy pad 213' may be effectively prevented.

Figure 7:
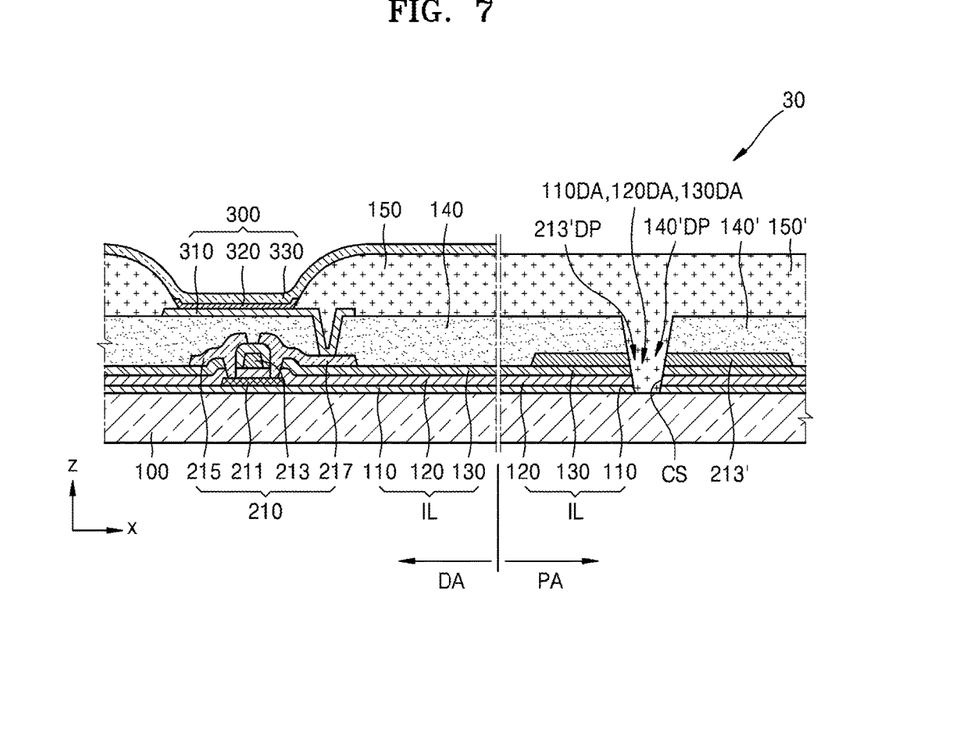
FIG. 7 is a cross-sectional view schematically illustrating a display device according to another embodiment.

Meanwhile, FIG. 7 illustrates a cross-sectional view schematically illustrating a display device 30 according to another embodiment. As illustrated in FIG. 7, the display device 30 includes an additional insulating layer 140' covering the dummy pad 213'. The additional insulating layer 140' may include the same material as the protecting layer 140 of the display area DA. Moreover, the additional insulating layer 140' may be a single body with the protecting layer 140. In this case, the protecting layer 140 may extend from the display area DA into the peripheral area PA, and the additional insulating layer 140' may be understood as a portion of the protecting layer 140.

The additional insulating layer 140' may include an inorganic material, such as silicon oxide, silicon nitride, and/or silicon oxynitride, like the protecting layer 140. When cracks occur in the additional insulating layer 140', the cracks may grow toward an inside of the display area DA. Accordingly, the additional insulating layer 140' may also include an additional non-continuous area 140'DA and may prevent growing of the cracks into the display area DA.

At least a portion of the additional non-continuous area 140'DA may overlap the first through the third non-continuous areas 110DA, 120DA, and 130DA of the insulating layer IL. FIG. 7 illustrates that the additional non-continuous area 140'DA matches the first through the third non-continuous areas 110DA, 120DA, and 130DA of the insulating layer IL, and thus the side surface of the first non-continuous area 110DA of the buffer layer 110, the side surface of the second non-continuous area 120DA of the insulating layer 120, the side surface of the third non-continuous area 130DA of the interlayer insulating layer 130, a side surface of the non-continuous portion 213'DP of the dummy pad 213', and a side surface of the additional non-continuous area 140'DA of the additional insulating layer 140' may form a continuous surface CS. In a manufacturing process of the display device, the buffer layer 110, the gate insulating layer 120, and the interlayer insulating layer 130, the dummy pad 213', and the additional insulating layer 140' are simultaneously patterned to form the first through the third non-continuous areas 110DA, 120DA, and 130DA, the non-continuous portion 123'DP, and the additional non-continuous area 140'DA, respectively.

Meanwhile, differently from the dummy pad 213' illustrated in FIG. 7, the dummy pad 213' may not include the non-continuous portion 213'DP. For example, considering the plan view as illustrated in FIG. 5, a portion, in which the dummy pad 213' is disposed, may be different from portions in which the first, second, and third non-continuing areas 110DA, 120DA, and 130DA are disposed. In this case, the dummy pad 213' may not include the non-continuous portion 213'DP. Nevertheless, when the additional insulating layer 140' covers the dummy pad 213', the additional insulating layer 140' may include the additional non-continuous area 140'DA. Here, at least a portion of the additional non-continuous area 140'DA of the additional insulating layer 140' may overlap the first through the third non-continuous areas 110DA, 120DA, and 130DA. Moreover, the side surface of the additional non-continuous area 140'DA of the additional insulating layer 140' and the side surfaces of the first through the third non-continuous areas 110DA, 120DA, and 130DA of the insulating layer IL may form a continuous surface. This may be applied to the previously described embodiments and modifications thereof and embodiments and modifications thereof, as described later.

Until now, the present disclosure illustrates that the insulating layer IL includes the first through the third non-continuous areas 110DA, 120DA, and 130DA in the peripheral area PA of the substrate 100. However, the present disclosure is not limited thereto. For example, an insulating layer existing in the peripheral area PA of the substrate 100 and including an inorganic material may include a non-continuous area so that cracks occurring in the peripheral area PA may be prevented from growing into the display area DA. If a display device includes this structure, the display device is also within the scope of the present disclosure.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A display device comprising:
a substrate comprising a display area and a peripheral area adjacent to the display area, the substrate having an outer boundary a portion of which is indented toward the display area;
a plurality of display elements disposed in the display area; and
an insulating layer disposed in the display area and the peripheral area, wherein the insulating layer has a non-continuous area disposed in the peripheral area of the substrate to be disposed between the indented portion of the outer boundary and the display area, wherein the non-continuous area extends along an imaginary straight line or an imaginary curved line, and wherein a length of the non-continuous area along the imaginary straight line or the imaginary curved line is larger than a maximum width of the indented portion.

2. The display device of claim 1, wherein a cross-section of the indented portion has a semicircular shape, the cross-section being parallel to the substrate.

3. The display device of claim 1, wherein the outer boundary has a non-indented portion, and wherein the non-continuous area extends along a direction parallel to the non-indented portion of the outer boundary of the substrate.

4. The display device of claim 1, wherein the insulating layer comprises a first insulating layer having a first non-continuous area and a second insulating layer having a second non-continuous area and wherein the non-continuous area comprises an overlapping portion in which the first non-continuous area and the second non-continuous area overlap each other in the depth dimension of the display device.

5. The display device of claim 4, wherein a side surface of the first non-continuous area of the first insulating layer and a side surface of the second non-continuous area of the second insulating layer form a continuous surface.

6. The display device of claim 1, wherein the insulating layer directly contacts an upper surface of the substrate at a portion thereof nearest to the non-continuous area.

7. The display device of claim 1, further comprising:
a dummy pad comprising a portion disposed over the substrate and extending in a direction thereof, the dummy pad being conductive.

8. The display device of claim 7, wherein the dummy pad comprises a non-continuous portion.

9. The display device of claim 8, wherein the non-continuous portion of the dummy pad at least partially overlaps the non-continuous area in the depth dimension of the display device.

10. The display device of claim 7, further comprising:
an additional insulating layer comprising an additional non-continuous area and covering the dummy pad.

11. The display device of claim 10, wherein the additional non-continuous area at least partially overlaps the non-continuous area in the depth dimension of the display device.

12. The display device of claim 10, wherein a side surface of the non-continuous area of the insulating layer and a side surface of the additional non-continuous area of the additional insulating layer form a continuous surface.

13. The display device of claim 10, wherein the dummy pad comprises a non-continuous portion and wherein the additional non-continuous area overlaps the non-continuous area and the non-continuous portion in the depth dimension of the display device.

14. The display device of claim 13, wherein a side surface of the non-continuous area of the insulating layer, a side surface of the non-continuous portion of the dummy pad, and a side surface of the additional non-continuous area of the additional insulating layer form a continuous surface at an overlapping portion in which the non-continuous area, the non-continuous portion, and the additional non-continuous area overlap each other.

15. The display device of claim 1, wherein the insulating layer is formed of an inorganic material.

16. The display device of claim 1, further comprising a protecting layer covering the non-continuous area of the insulating layer.

17. The display device of claim 16, further comprising:
a pixel defining film covering a boundary of each pixel electrode of the plurality of display elements,
wherein the protecting layer is formed of the same material as the pixel defining film.

18. The display device of claim 17, wherein the pixel defining film extends from the display area into the peripheral area and wherein the protecting layer is a portion of the pixel defining film.

19. The display device of claim 1, wherein the insulating layer extends into the display area.

20. The display device of claim 1, wherein the insulating layer is formed in the display area and the peripheral area, wherein the insulating layer is continuous in the display area and continuously extends from the display area to a border between the display area and the peripheral area.

21. The display device of claim 1, further comprising a thin film transistor (TFT) interposed between the substrate and the display elements, wherein the insulating layer contacts and extends from the TFT.

22. The display device of claim 1, wherein the insulating layer comprises a plurality of insulating layers vertically stacked with respect to each other, wherein the insulating layers have openings formed therein to define the non-continuous area, wherein the insulating layers comprise a lowermost insulating layer closest to the substrate and an uppermost insulating layer farthest from the substrate, and wherein the areas of the openings gradually increase from the lowermost insulating layer to the uppermost insulating layer.

* * * * *